(12) United States Patent
Shin

(10) Patent No.: US 12,669,527 B2
(45) Date of Patent: Jun. 30, 2026

(54) APPARATUS AND METHOD FOR DIAGNOSING PHASE CURRENT SENSOR FAILURE OF 3-PHASE INVERTER

(71) Applicant: HL Mando Corporation, Pyeongtaek-si (KR)

(72) Inventor: Hye-Ung Shin, Suwon-si (KR)

(73) Assignee: HL MANDO CORPORATION, Pyeongtaek-si (KR)

( * ) Notice: Subject to any disclaimer, the term of this patent is extended or adjusted under 35 U.S.C. 154(b) by 476 days.

(21) Appl. No.: 18/207,258

(22) Filed: Jun. 8, 2023

(65) Prior Publication Data

US 2023/0408563 A1     Dec. 21, 2023

(30) Foreign Application Priority Data

Jun. 20, 2022    (KR) ........................ 10-2022-0074839

(51) Int. Cl.
| | |
|---|---|
| *G01R 25/00* | (2006.01) |
| *B62D 5/04* | (2006.01) |
| *H02P 21/05* | (2006.01) |
| *H02P 21/22* | (2016.01) |
| *H02P 27/08* | (2006.01) |

(52) U.S. Cl.
CPC ............. *G01R 25/00* (2013.01); *B62D 5/049* (2013.01); *H02P 21/05* (2013.01); *H02P 21/22* (2016.02); *H02P 27/08* (2013.01)

(58) Field of Classification Search
CPC ........ H02P 29/024; H02P 21/22; H02P 21/05; H02P 27/08; G01R 31/343; G01R 25/00; B62D 5/049
See application file for complete search history.

(56) References Cited

U.S. PATENT DOCUMENTS

| | | | | |
|---|---|---|---|---|
| 10,224,843 | B2 * | 3/2019 | Hano | ........................ H02P 6/18 |
| 2019/0372498 | A1 | 12/2019 | Sasaki et al. | |

FOREIGN PATENT DOCUMENTS

| | | |
|---|---|---|
| KR | 10-2017-0090149 A | 8/2017 |
| KR | 10-2020-0057340 A | 5/2020 |

OTHER PUBLICATIONS

Korean Office Action issued on May 30, 2025, in connection with the corresponding Korean Patent Application No. 10-2022-0074839, citing the above reference(s), along with an English machine translation. (9 pages).

* cited by examiner

*Primary Examiner* — An H Do
(74) *Attorney, Agent, or Firm* — Hauptman Ham, LLP

(57) ABSTRACT
The present disclosure relates to an apparatus and method for diagnosing a failure, which may include a motor, an inverter for driving the motor, a phase current sensor for respectively detecting a phase current supplied to the motor from the inverter, and a controller for converting the phase current detected by the phase current sensor into a current, obtaining an average value of the current in one cycle and comparing the magnitude and angle of the average value with a reference value to determine a failure of the phase current sensor.

17 Claims, 7 Drawing Sheets

APPARATUS AND METHOD FOR DIAGNOSING PHASE CURRENT SENSOR FAILURE OF 3-PHASE INVERTER

CROSS-REFERENCE TO RELATED APPLICATION

This application claims priority to and the benefit of Korean Patent Application No. 10-2022-0074839, filed on Jun. 20, 2022, the disclosure of which is incorporated herein by reference in its entirety.

TECHNICAL FIELD

The present disclosure relates to an apparatus and method for diagnosing a phase current sensor failure of a 3-phase inverter, and more specifically to an apparatus and method which are capable of confirming the failure of a phase current sensor of a 3-phase inverter for an electronic steering device.

BACKGROUND ART

In general, an electric steering system is applied to most vehicles, and particularly, the electric steering system is used in various fields such as an automatic parking system, a lane keeping system and the like.

In the electric steering system, the vehicle is steered by a motor, and if an inverter that supplies power to the motor or an electronic control unit that controls the inverter malfunctions, problems occur in the steering operation, and as a result, this may eventually cause big problems to the driver's safety.

In order to detect such an abnormality in the steering operation, a phase current sensor for detecting 3-phase current has been applied to the inverter, and it is possible to check whether the steering operation is normal by checking the current detected by the phase current sensor.

This technical configuration is described in Korean Registered Patent No. 10-2164956 (APPARATUS FOR CONTROLLING MOTOR METHOD THEREOF, registered on Oct. 6, 2020), which describes a configuration in which the 3-phase AC current flowing in a 3-phase motor is checked in a control device including an inverter that drives the 3-phase motor, and if there is an error, it compensates for the current detect deviation.

However, this configuration is based on the fact that there is no abnormality in the current sensor itself, and it compensates for the current by controlling the inverter by the deviation between the current value detected by the current sensor and the reference value.

That is, in the related art, since the current value detected by the current sensor is recognized and processed as a highly reliable value, even if a current value different from the actual one is detected due to an error in the current sensor itself, processing such as compensation is performed, and thus, problems such as excessive current being supplied to a specific phase may occur.

In particular, the phase current sensor of an inverter is an important element that is required to control a steering device, and it is used for the torque control and current control of a synchronous motor for the steering device.

These controllers perform closed-loop control and measure the actual current to enable the closed-loop control.

In this case, if the command torque and command current are not satisfied due to a failure of the phase current sensor, desired steering is impossible, and noise and vibration may occur.

DISCLOSURE

Technical Problem

The technical problem to be solved by the present disclosure in consideration of the above problems is directed to providing a diagnostic device and method which are capable of checking the failure of a phase current sensor of a 3-phase inverter.

Technical Solution

In order to solve the problems as described above, the apparatus for diagnosing a failure according to an aspect of the present disclosure may include a motor; an inverter for driving the motor; a phase current sensor for respectively detecting a phase current supplied to the motor from the inverter; and a controller for converting the phase current detected by the phase current sensor into a current, obtaining an average value of the current in one cycle and comparing the magnitude and angle of the average value with a reference value to determine a failure of the phase current sensor.

In an exemplary embodiment of the present disclosure, the motor may be a 3-phase motor, and the phase current sensor may include first to third phase current sensors for respectively detecting A-phase current, B-phase current and C-phase current supplied to the 3-phase motor.

In an exemplary embodiment of the present disclosure, the controller may compare the angle (rad/s) of the average value with a reference value, only when the magnitude of the average value is maintained for a reference time or longer.

In an exemplary embodiment of the present disclosure, the reference value for comparing the angle of the average value may be respectively set for the A-phase current, B-phase current and C-phase current.

In an exemplary embodiment of the present disclosure, the reference value for comparing the angle of the average value for the A-phase current may be 0.2 to 0.7 rad/s.

In an exemplary embodiment of the present disclosure, the reference value for comparing the angle of the average value for the B-phase current may be 2.5 to 2.8 rad/s.

In an exemplary embodiment of the present disclosure, the reference value for comparing the angle of the average value for the C-phase current may be −1.7 to −1.1 rad/s.

In an exemplary embodiment of the present disclosure, the controller may determine a failure when the angle of the average value is maintained for a reference time or longer in the range of the reference value.

In an exemplary embodiment of the present disclosure, if the angle of the average value is maintained for the reference time or longer in the range of the reference value and the fault current detected in each phase is less than the magnitude of the average value, the controller may display a failure of the phase current sensor that has detected a current in the corresponding phase.

In an exemplary embodiment of the present disclosure, the apparatus may further include a space vector pulse-width modulator for driving the inverter; and a current controller for providing phase and amplitude information to the space vector pulse-width modulator.

In an exemplary embodiment of the present disclosure, the apparatus may further include a DQ converter for converting the phase current detected by the phase current sensor into d-axis and q-axis currents; and a torque ripple remover for controlling the current controller so as to receive the current of the DQ converter and remove a torque ripple.

In an exemplary embodiment of the present disclosure, the apparatus may further include a speed detector for detecting a speed of the motor; and a target current generator for comparing the speed detected by the speed detector with a torque reference value, generating a target current and providing the target current to the current controller.

The method for diagnosing a failure according to another aspect of the present disclosure may include the steps of a) detecting a phase current which is supplied from an inverter to a motor in a phase current sensor; b) pre-processing the detected phase current to obtain the magnitude and angle of the average value of the phase current; c) confirming whether the magnitude of the average value of the phase current is maintained to be greater than or equal to a first reference value by exceeding a first reference time; and d) determining whether a state in which the angle of the average value of the phase current falls within a reference range exceeds a second reference time, if the magnitude of the average value of the phase current is maintained to be greater than or equal to the first reference value by exceeding the first reference time, and if exceeding, determining as a failure of the phase current sensor that has detected the corresponding phase current.

In an exemplary embodiment of the present disclosure, the motor may be a 3-phase motor, and the phase current sensor may include first to third phase current sensors for respectively detecting A-phase current, B-phase current and C-phase current supplied to the 3-phase motor.

In an exemplary embodiment of the present disclosure, the pre-processing of step b) may convert a 3-phase current into a current of the d and q stationary coordinate system.

In an exemplary embodiment of the present disclosure, the reference range for comparing the angle of the average value may be respectively set for the A-phase current, B-phase current and C-phase current.

In an exemplary embodiment of the present disclosure, the reference range for comparing the angle of the average value for the A-phase current may be 0.2 to 0.7 rad/s.

In an exemplary embodiment of the present disclosure, the reference range for comparing the angle of the average value for the B-phase current may be 2.5 to 2.8 rad/s.

In an exemplary embodiment of the present disclosure, the reference range for comparing the angle of the average value for the C-phase current may be −1.7 to −1.1 rad/s.

In an exemplary embodiment of the present disclosure, the angle of the average value may be maintained for a reference time or longer in the reference range, and if the fault current detected in each phase is less than the magnitude of the average value, it may display a failure of the phase current sensor that has detected a current in the corresponding phase.

Advantageous Effects

The present disclosure has an effect of ensuring the safety of a vehicle by detecting the failure of each phase current sensor by using the magnitude and angle of the d-axis and q-axis during one period and displaying the occurrence of failure to the driver.

MODES OF THE INVENTION

Figure 1:
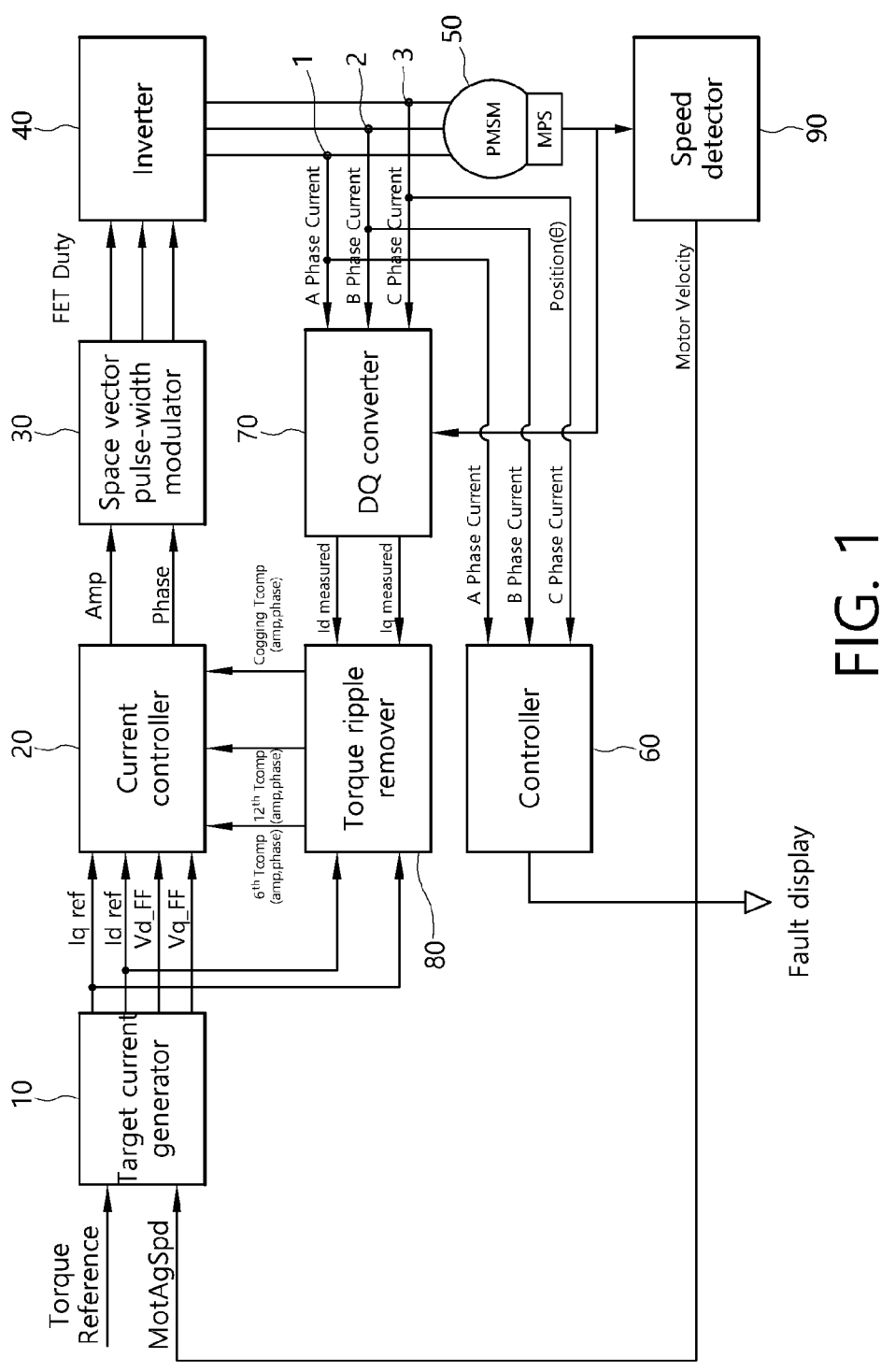
FIG. 1 is a block diagram of the apparatus for diagnosing a phase current sensor failure of a 3-phase inverter according to a preferred exemplary embodiment of the present disclosure.

Hereinafter, the apparatus and method for diagnosing a phase current sensor failure of a 3-phase inverter according to the present disclosure will be described in detail with reference to the accompanying drawings.

The exemplary embodiments of the present disclosure are provided to further completely explain the present disclosure to one of ordinary skill in the art to which the present disclosure pertains. However, the exemplary embodiments described below may be modified in many different forms, and the scope of the present disclosure is not limited to the following exemplary embodiments. Rather, these exemplary embodiments are provided to render the present disclosure more thorough and complete, and to fully convey the spirit of the present disclosure to those skilled in the art.

Terms used in the present specification are used for explaining a specific exemplary embodiment, not for limiting the present disclosure. The expression of singularity in the present specification includes the expression of plurality unless clearly specified otherwise in context. In addition, terms such as "comprise" and/or "comprising" may be construed to denote a certain characteristic, number, step, operation, constituent element or a combination thereof, but may not be construed to exclude the existence of or a possibility of addition of one or more other characteristics, numbers, steps, operations, constituent elements or combinations thereof. As used in the present specification, the term "and/or" includes any one of listed items and all of at least one combination of the items.

It will be understood that although the terms "first", "second" and the like may be used herein to describe various components, areas and/or portions, it is apparent that these components, parts, areas, layers and/or portions should not be limited by these terms. The terms do not mean a particular order, top and bottom, or merits and demerits but are only used to distinguish one member, area or portion from another member, area or portion. Accordingly, a first member, area or portion that will be described below may indicate a second member, area or portion without deviating from teachings of the present disclosure.

Hereinafter, the exemplary embodiments of the present disclosure are described in detail with reference to the accompanying drawings that schematically illustrate the exemplary embodiments of the present disclosure. In the drawings, the illustrated shapes may be modified according to, for example, manufacturing technology and/or tolerance. Therefore, the exemplary embodiments of the present disclosure may not be construed to be limited to the specific shape of a part described in the present specification and may include for example, a change in the shape generated during manufacturing.

Figure 2:
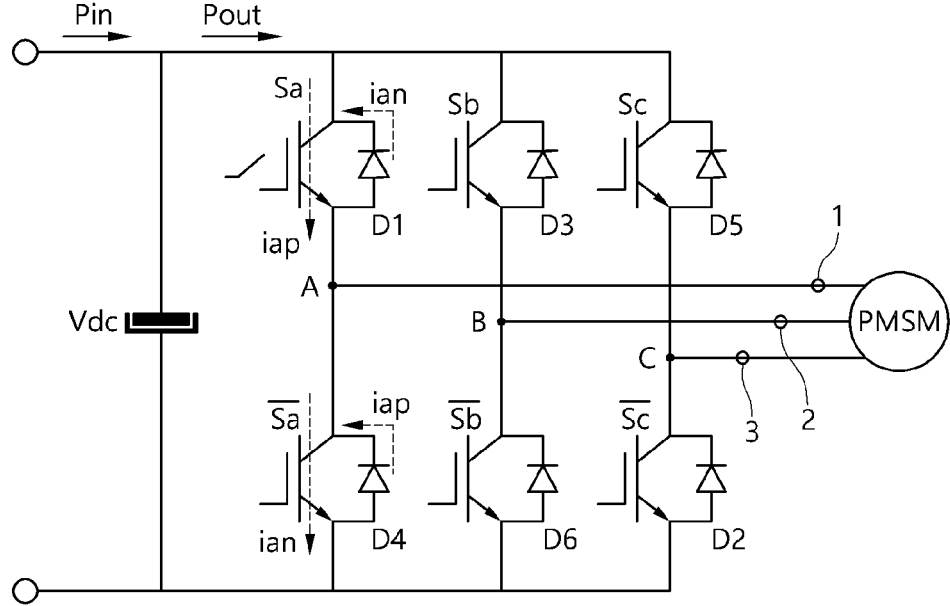
FIG. 2 is a block configuration diagram of an inverter in FIG. 1.

FIG. 1 is a block diagram of the apparatus for diagnosing a phase current sensor failure of a 3-phase inverter according to a preferred exemplary embodiment of the present disclosure, and FIG. 2 is a block configuration diagram of an inverter 40 in FIG. 1.

Referring to FIGS. 1 and 2, respectively, the present disclosure is configured by including a target current generator 10 for generating a target current by receiving the speed detection result of a motor 50 of a speed detector 90 and a torque reference value, a current controller 20 for receiving the target current of the target current generator 10 and performing current control, a torque ripple remover 80 for receiving the target current of the target current generator 10 and providing a periodic signal to the current controller 20 to remove the generation of a torque ripple, a space vector pulse-width modulator 30 for performing pulse width modulation by using the output of the current controller 20, an inverter 40 for driving the motor 50 under switching control by the output of the space vector pulse-width modulator 30, first to third phase current sensors 1, 2, 3 for detecting phase currents of the inverter 40, a DQ converter 70 for converting the detection results of the first to third phase current sensors 1, 2, 3 into d-axis and q-axis currents and providing the same to the torque ripple remover 80, and a controller 60 for checking and displaying whether each phase current sensor has a failure by using the phase current detection result of the first to third phase current sensors 1, 2, 3.

Hereinafter, the configuration and operation of the apparatus for diagnosing a failure according to a preferred exemplary embodiment of the present disclosure configured as described above will be described in more detail.

First of all, the target current generator 10 receives the torque reference value and the speed of the motor 50 detected by the speed detector 90 to determine d-axis and q-axis reference currents Id ref, Iq ref, and provides the information to the current controller 20.

The target current generator 10 may include d-axis and q-axis current command generation tables.

The current controller 20 provides amplitude and phase information corresponding to the d-axis and q-axis reference currents to the space vector pulse-width modulator (SVPWM) 30.

The space vector pulse-width modulator 30 performs switch control of the inverter 40 by performing pulse-width modulation.

Referring to FIG. 2, the inverter 40 supplies A, B and C-phase currents to the motor 50 by using the charging voltage of a DC link capacitor Vdc according to the state of the switches.

The open/closed state of the switches SHa, SHb, SHc, SLa, SLb, SLc is controlled by the space vector pulse-width modulator 30.

A, B and C-phase currents are determined according to the states of the switches SHa, SHb, SHc, SLa, SLb, SLc, and each phase current is input to the motor 50.

The motor 50 may be a permanent magnet synchronous motor (PMSM) for an electronic steering device.

A, B and C-phase currents that are input to the motor 50 are detected by a first phase current sensor 1, a second phase current sensor 2 and a third phase current sensor 3, respectively.

The A, B and C-phase currents detected by the first phase current sensor 1, the second phase current sensor 2 and the third phase current sensor 3 are provided to the DQ converter 70.

The DQ converter 70 transforms the coordinate system, converts the coordinate system into linearization and direct current, generates detection currents for the d-axis and q-axis, which are plane coordinate systems, and provides the same to the torque ripple remover 80.

The torque ripple remover 80 may be a harmonic disturbance controller, and may convert the $6^{th}$ and $12^{th}$ harmonics to control set points that are set to a value of 0 to remove the torque ripple to prevent the occurrence of ripples in the speed of the motor 50.

In this configuration, the present disclosure further includes a controller 60 for detecting the failure of the first phase current sensor 1, the second phase current sensor 2 and the third phase current sensor 3 by using the current which is respectively detected in the first phase current sensor 1, the second phase current sensor 2 and the third phase current sensor 3.

After the controller 60 converts the current of each phase into the current of the d-axis and q-axis of the stationary coordinate system according to the given program, it calculates the average for one period, and then calculates the size and angle to diagnose the failure.

The operation of the controller 60 will be described in more detail as follows.

First of all, the controller 60 receives the A-phase current detected by the first phase current sensor 1, the B-phase current detected by the second phase current sensor 2, and the C-phase current detected by the third phase current sensor 3, and converts the same into currents for the d-axis and q-axis of the stationary coordinate system, respectively.

The current conversion equation is shown in Mathematical Formula 1 below.

$$i_d^s = \frac{2}{3}i_a^s - \frac{1}{3}(i_d^s + i_c^s),\ i_q^s = \frac{1}{\sqrt{3}}(i_b^s - i_c^s) \qquad \text{[Mathematical Formula 1]}$$

In Mathematical Formula 1, $i_d^s$ is the d-axis current, $i_q^s$ is the q-axis current, $i_a^s$ is the A-phase current detected by the first phase current sensor 1, $i_b^s$ is the B-phase current detected by the second phase current sensor 2, and $i_c^s$ is the C-phase current detected by the third phase current sensor 3.

Mathematical Formula 1 above is an example of converting 3-phase current into d-axis and q-axis currents of the stationary coordinate system by using Park's vector conversion method.

Next, the converted d-axis and q-axis currents are averaged over a specific period.

The average of the d-axis and q-axis currents in one specific period may be obtained by Mathematical Formula 2 below.

$$\mu_x = \frac{1}{N}\sum_{k=1}^{N} i_x(k\tau) \qquad \text{[Mathematical Formula 2]}$$

In Mathematical Formula 2, x is d or q, which means the average current (μ) of the d-axis current and the q-axis current, respectively. That is, the average of the d-axis current is expressed as μd, and the average of the q-axis current is expressed as μq. τ is the time constant.

From the average current obtained in this way, the magnitude and angle of the current may be obtained by Mathematical Formula 3 below.

$$\mu = \mu_d = j\mu_q = M_\mu \angle \theta_\mu \qquad \text{[Mathematical Formula 3]}$$

$$M_\mu = \sqrt{(\mu_d)^2 + (\mu_q)^2}, \; \theta_\mu = \tan^{-1}\frac{\mu_q}{\mu_d}$$

In Mathematical Formula 3 above, $M_\mu$, represents the magnitude of the average current, and $\Theta\mu$ represents the angle.

The obtained magnitude ($M\mu$) and angle ($\Theta\mu$) are compared with reference values and used for the diagnosis of failure of each phase current sensor 1, 2, 3.

Figure 3:
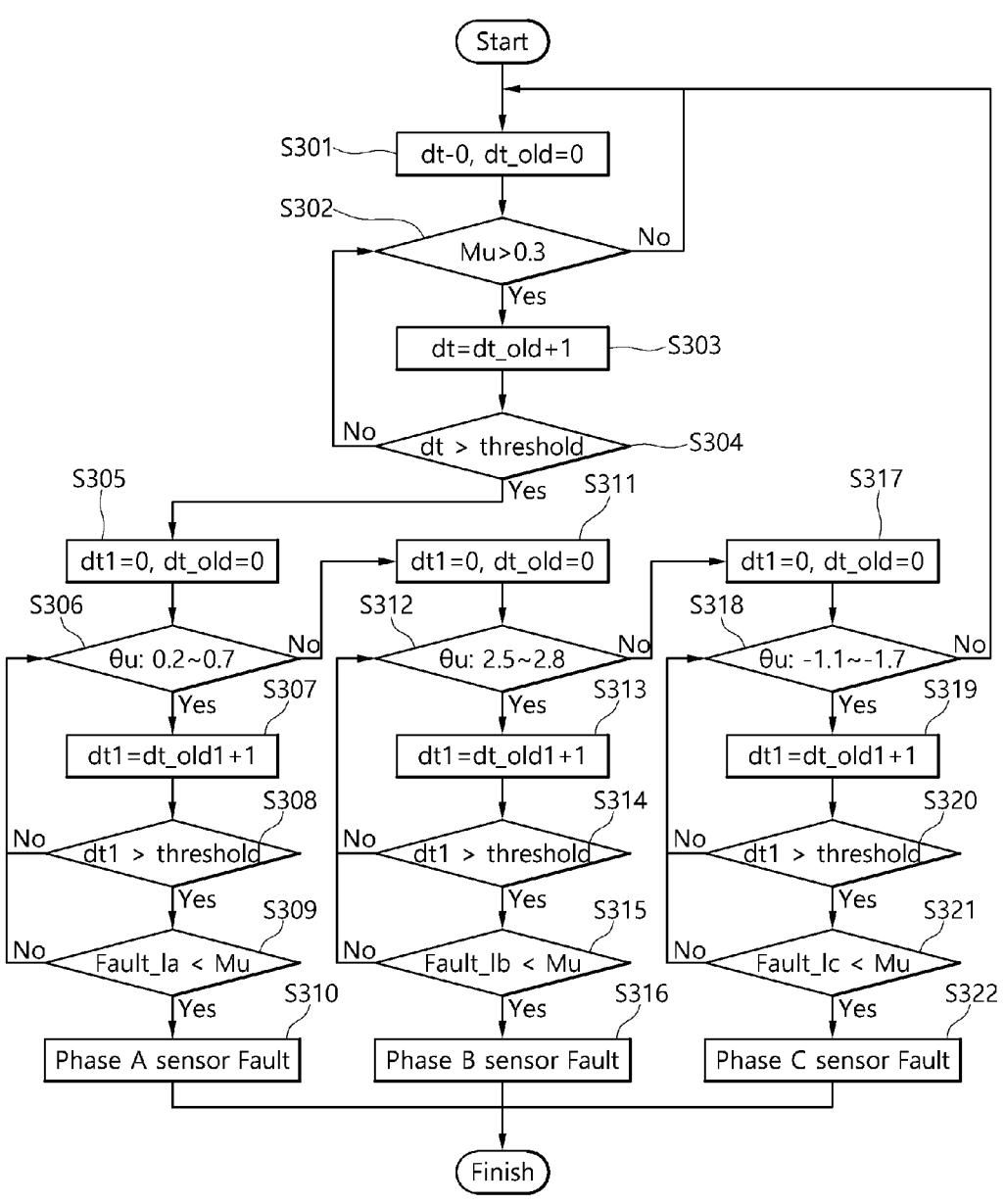
FIG. 3 is a flowchart of the method for diagnosing a phase current sensor failure of a 3-phase inverter according to a preferred exemplary embodiment of the present disclosure.

FIG. 3 is a flowchart of the method for diagnosing a phase current sensor failure of a 3-phase inverter according to a preferred exemplary embodiment of the present disclosure. The method illustrated in FIG. 3 is assumed to be performed in the controller 60.

First of all, as in step S301, dt and dt_old of the previous state are initialized to 0.

Next, as in step S302, it is determined whether the magnitude ($M\mu$) of the average current obtained through Mathematical Formula 3 is greater than 0.3 A.

If the magnitude of the average current is greater than 0.3 A, the current time state is increased as in step S303, and in step S304, it is checked whether dt is greater than or equal to a set reference time. In this case, the set reference time is an arbitrarily set time, and it may be varied as needed.

The setting of the reference time is to confirm the duration of the magnitude of the current and the duration of the angle.

That is, it is possible to check whether the current sensor is abnormal by checking whether the range of magnitudes or angles to be described below continues for a reference time.

Next, as a result of the determination in step S304, when the current time exceeds the reference time, the time for determining the angle dt1 and the time for determining the previous angle dt_old1 are initialized to 0 as in step S305, and it is checked whether the angle $\Theta\mu$ is in the range of 0.2 to 0.7 rad/s as in step S306.

As a result of the determination in step S306, if the angle is within the range of 0.2 to 0.7 rad/s, dt1 is increased as in step S307, and it is checked whether the increased dt1 exceeds the reference time as in step S308.

As a result of the determination in step S308, if dt1 does not exceed the reference time, steps S306 to S308 are re-performed.

As a result of the determination in step S308, if dt1 exceeds the reference time, if the fault current Ia of phase A is smaller than the magnitude of the average current $M\mu$, as in step S309, it displays that the first phase current sensor 1 that has detected the A-phase current is faulty as in step S310.

The display at this time may be shown on the instrument panel of a vehicle.

As a result of the determination in step S306, if the angle $\Theta\mu$ is not in the range of 0.2 to 0.7 rad/s, dt1 is initialized again as in step S311, and it is checked whether it falls within the range of 2.5 to 2.8 degrees as in step S312.

If it falls within this range, dt1 is increased as in step S313, and it is checked whether the increased dt1 exceeds the reference time as in step S314.

If the reference time is exceeded, it is determined whether the B-phase fault current Ib is smaller than the average current $M\mu$ as in step S315. If it is determined that the B-phase fault current Ib is smaller than the average current $M\mu$, it displays that the second-phase current sensor 2 that has detected the B-phase current is faulty as in step S316.

As a result of the determination in step S312, if the angle is not included in the range of 0.2 to 0.7 rad/s, dt1 and dt_old1 are initialized as in step S317, and it is checked whether the angle is in the range of −1.7 to −1.1 rad/s as in step S318. As a result of the determination in step S318, if the angle $\Theta\mu$ is not in the range of −1.7 to −1.1 rad/s, the process is performed again from step S301.

As a result of the determination in step S318, if the angle (Op) is in the range of −1.7 to −1.1 rad/s, dt1 is increased as in step S319, and it is checked whether the increased dt1 exceeds the reference time as in step S320.

If exceeded, it is checked whether the fault current Ic of phase C is less than the current average size as in step S321. If Ic is less than $M\mu$, it is displays that the third phase current sensor 3 that has detected the C-phase current is faulty.

Through this process, the present disclosure may check whether the first to third phase current sensors 1, 2, 3 that respectively detect the 3-phase current are faulty.

Figure 4:
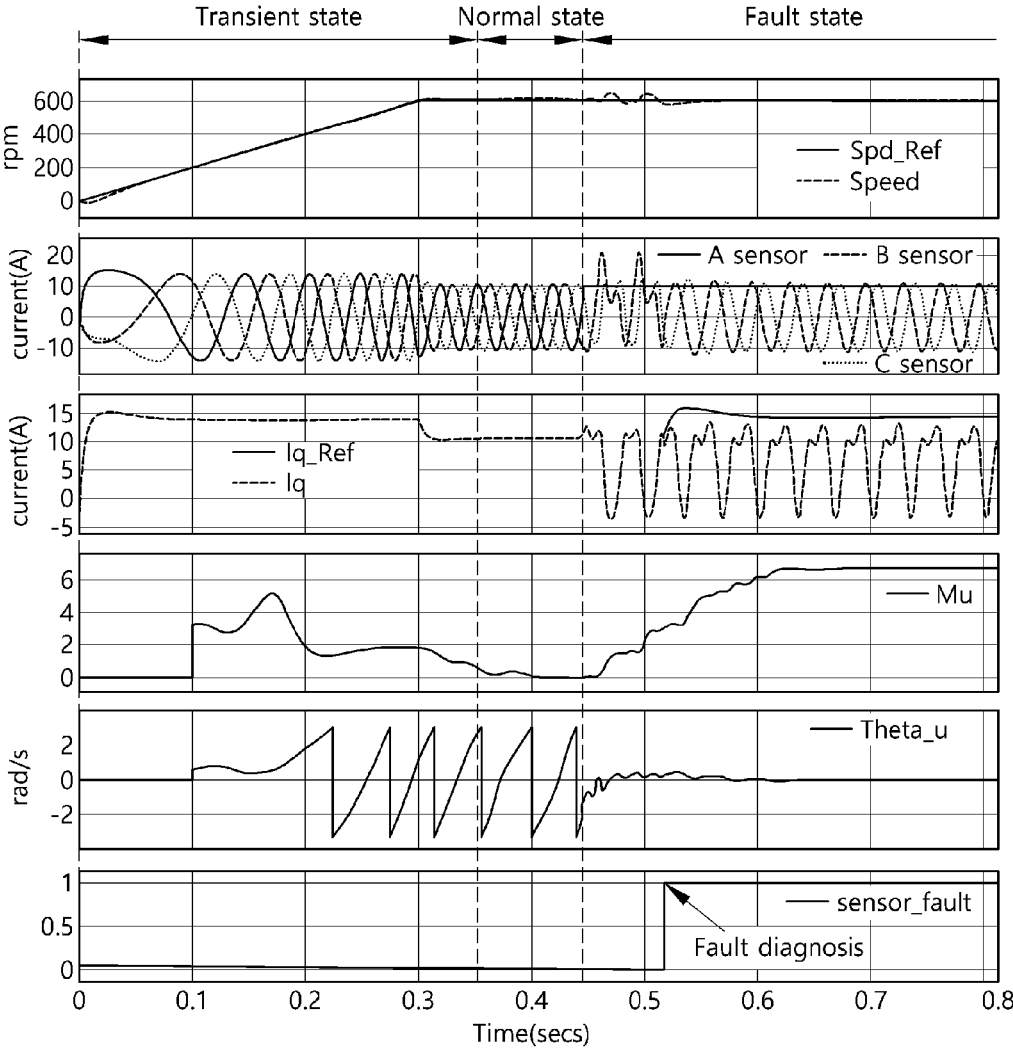
FIGS. 4 to 6 are failure diagnosis simulation results for each phase, respectively.

FIG. 4 is a failure diagnosis simulation result diagram of the first phase current sensor that detects the A-phase current.

This simulation is a simulation result assuming that a failure occurs in the phase current sensor while the motor 50 is driven at a speed of 600 rpm.

It is assumed that a measurement current of 10 A is detected when the first phase current sensor 1 is faulty.

After passing through a transient state in which the motor 50 is accelerated to 600 rpm, when the normal state is maintained and a failure occurs in the first phase current sensor 1, it is determined as a failure if the average magnitude $M\mu$ of the current continues to be 0.3 A or more for more than a reference time, the angle $\Theta\mu$ is maintained for a reference time in the range of 0.2 to 0.7 rad/s, and the A-phase fault current is less than the average size.

Figure 5:
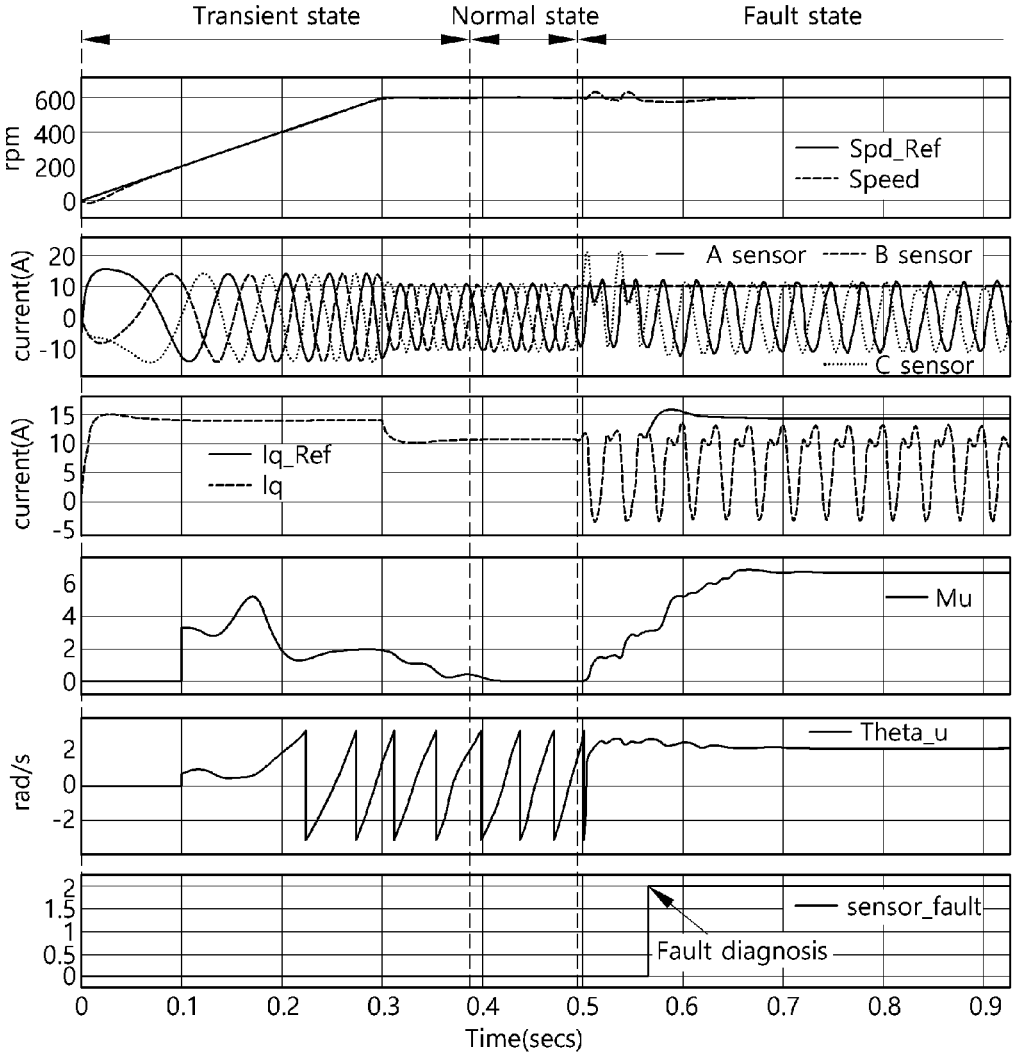

FIG. 5 is a failure diagnosis simulation result diagram of the second phase current sensor 2 that detects the B-phase current.

The speed condition of the motor 50 is the same as the example of FIG. 4, and it is determined as a failure, if $\Theta\mu$ is maintained for a reference time in the range of 2.5 to 2.8 rad/s, and the B-phase fault current is less than the average size.

Figure 6:
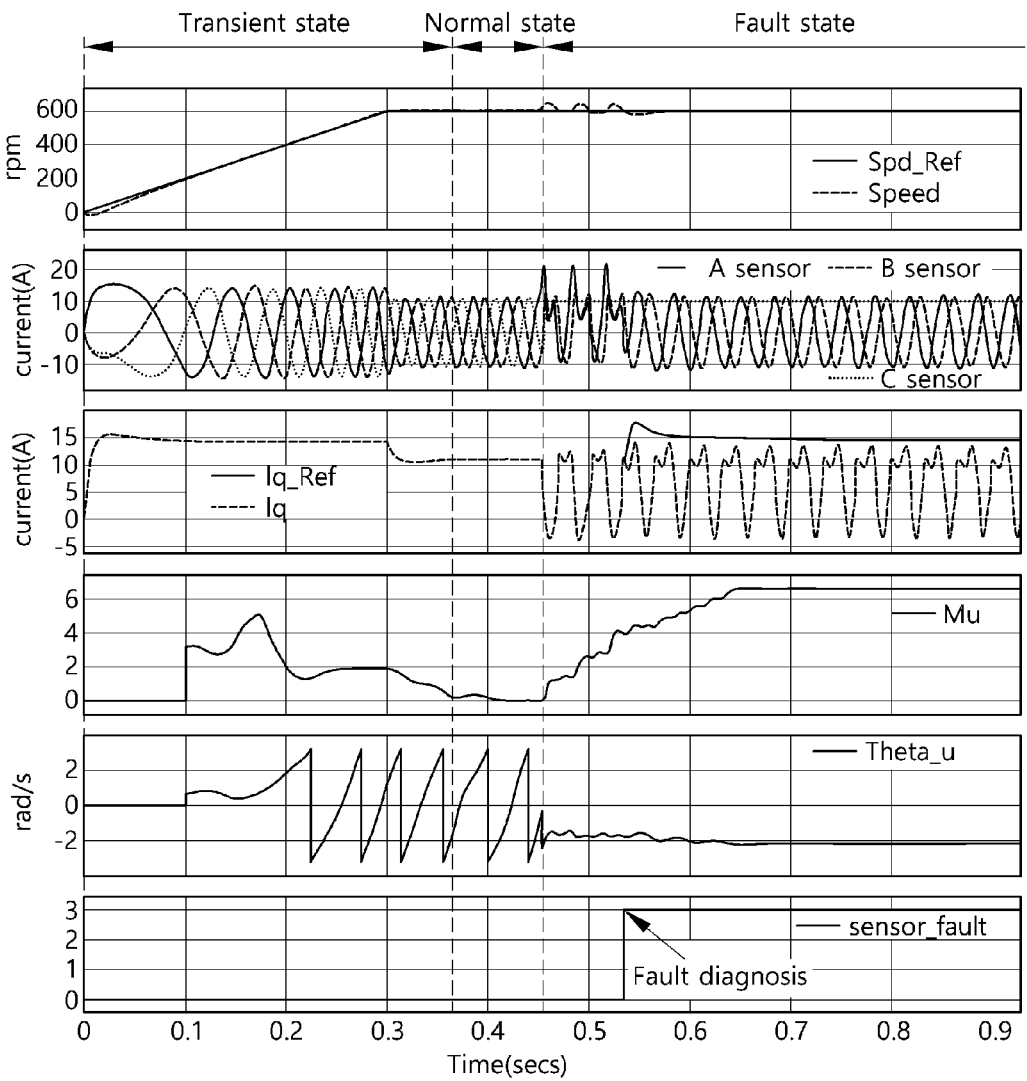

FIG. 6 is a failure diagnosis simulation result diagram of the third-phase current sensor 3 that detects the C-phase current.

When $\Theta\mu$ is maintained for a reference time in the range of −1.7 to −1.1 rad/s and the C-phase fault current is less than the average size, it is determined as a failure.

The failure diagnosis method of the present disclosure is further simplified and summarized as follows.

Figure 7:
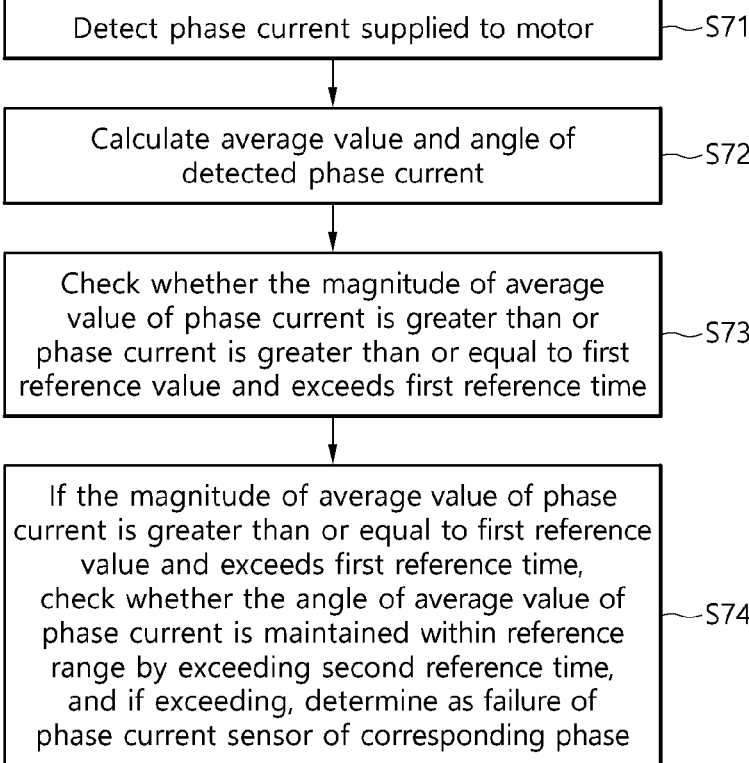
FIG. 7 is a flowchart of the method for diagnosing a phase current sensor failure of a 3-phase inverter according to another exemplary embodiment of the present disclosure.

FIG. 7 is a flowchart of the method for diagnosing a phase current sensor failure of a 3-phase inverter according to the present disclosure.

Referring to FIG. 7, the present disclosure includes the steps of detecting a phase current supplied from an inverter to a motor S71, obtaining the magnitude and angle of the average value of the detected phase current S72, checking whether the magnitude of the average value of the phase current is maintained to be greater than or equal to a first reference value by exceeding a first reference time S73, and determining a phase current sensor failure, if the magnitude of the average value of the phase current is maintained to be greater than or equal to the first reference value by exceeding the first reference time, and if the angle of the average value of the phase current is compared with a second reference time and exceeds the same S74.

Hereinafter, the method for diagnosing a failure according to the present disclosure configured as described above will be described in more detail.

First of all, in step S71, the phase current supplied from the inverter 40 to the motor 50 is detected through a phase current sensor.

The motor 50 is a 3-phase motor, and the phase current sensors include a first phase current sensor 1, a second phase current sensor 2 and a third phase current sensor 3 that detect A, B, and C phases that are supplied to the motor 50, respectively.

Next, in step S72, the magnitude and angle of the average value of the phase currents are obtained by pre-processing the detected phase currents.

In this case, the pre-processing is to convert each of the 3-phase currents into currents in the stationary coordinate system of d and q, and the average current value and angle of each phase may be confirmed in the plane coordinate system.

Next, in step S73, it is checked whether the obtained average value of each phase current is greater than or equal to a first reference value, and it is checked whether the time in which it is maintained to be greater than or equal to the first reference value exceeds a first reference time.

Specifically, the d-axis current average value and the q-axis current average value of the A-phase, B-phase and C-phase currents are obtained, respectively, and it is checked whether the obtained d-axis and q-axis current average values are greater than or equal to the first reference value.

In this case, the reference value for each phase may be set differently for each phase.

Next, it is checked whether the average current value that is greater than or equal to the first reference value is maintained by exceeding the first reference time.

In this case, the first reference time may be arbitrarily set.

Next, as in step S74, when the magnitude of the average phase current value is maintained to be greater than or equal to the first reference value by exceeding the first reference time, it is checked whether the angle of the average phase current value falls within a reference range.

The reference range at this time may be set differently for each phase.

For example, the reference range for the A-phase current may be 0.2 to 0.7 rad/s, the reference range for the B-phase current may be 2.5 to 2.8 rad/s, and the reference range for the C-phase current may be −1.7 to −1.1 rad/s.

When the state in which the angle of the average value of each phase current falls within the respective reference range is maintained for the second reference time or longer, it is checked whether the fault current detected in each phase is less than the average value of each phase current, and if it is less, the phase current sensor that has detected the corresponding phase current is determined as faulty.

It will be apparent to those skilled in the art that the present disclosure is not limited to the above exemplary embodiments and may be variously modified or changed without departing from the technical gist of the present disclosure.

[Explanation of Reference Numerals]

| | |
|---|---|
| 10: Target current generator | 20: Current controller |
| 30: Space vector pulse-width modulator | 40: Inverter |
| 50: Motor | 60: Controller |

-continued

[Explanation of Reference Numerals]

| | |
|---|---|
| 70: DQ converter | 80: Torque ripple remover |
| 90: Speed detector | 1: First phase current sensor |
| 2: Second phase current sensor | 3: Third phase current sensor |

The invention claimed is:

1. An apparatus for diagnosing a failure of a phase current sensor, the apparatus comprising:
   a motor;
   an inverter configured to drive the motor;
   phase current sensors respectively configured to detect phase currents of three-phase current supplied to the motor from the inverter; and
   a controller configured to:
      convert the phase currents detected by the phase current sensors into d-axis and q-axis currents;
      calculate an average values of the d-axis and q-axis currents in one cycle;
      determine a first condition maintained for a first reference time or longer, the first condition being defined such that a magnitude of the average values is greater than a first reference value;
      in response to determining that the first condition is maintained for the first reference time or longer, determine a second condition maintained for a second reference time or longer, the second condition being defined such that an angle of the average values falls within reference ranges; and
      in response to determining that the second condition is maintained for the second reference time or longer, determine the failure of at least one of the phase current sensors.

2. The apparatus of claim 1, wherein the motor is a 3-phase motor, and
   wherein the phase current sensors comprise first to third phase current sensors for respectively detecting A-phase current, B-phase current and C-phase current supplied to the 3-phase motor.

3. The apparatus of claim 1, wherein the reference ranges comprise three ranges, each corresponding to a respective one of A-phase current, B-phase current and C-phase current.

4. The apparatus of claim 3, wherein one of the reference ranges for the A-phase current is 0.2 to 0.7 rad/s.

5. The apparatus of claim 3, wherein one of the reference ranges for the B-phase current is 2.5 to 2.8 rad/s.

6. The apparatus of claim 3, wherein one of the reference ranges for the C-phase current is −1.7 to −1.1 rad/s.

7. The apparatus of claim 1, wherein the controller is configured to:
   determine that one of the A-phase current, the B-phase current and the C-phase current is less than the magnitude of the average values; and
   determine the failure of at least one of the phase current sensors based on determining that one phase current is less than the magnitude of the average values.

8. The apparatus of claim 1, further comprising:
   a space vector pulse-width modulator configured to drive the inverter; and
   a current controller configured to provide phase and amplitude information to the space vector pulse-width modulator.

9. The apparatus of claim 8, further comprising:

a DQ converter configured to convert the phase currents detected by the phase current sensors into the d-axis and q-axis currents; and a torque ripple remover configured to control the current controller so as to receive a current of the DQ converter and remove a torque ripple.

10. The apparatus of claim 9, further comprising:

a speed detector configured to detect a speed of the motor; and a target current generator configured to compare the speed detected by the speed detector with a torque reference value, generating a target current and providing the target current to the current controller.

11. A method for diagnosing a failure of a phase current sensor, the method comprising:

detecting phase currents of three-phase current which is supplied from an inverter to a motor by phase current sensors;

converting the detected phase currents into d-axis and q-axis currents;

calculating an average values of the d-axis and q-axis currents in one cycle;

determining a first condition maintained for a first reference time or longer, the first condition being defined such that a magnitude of the average values is greater than a first reference value;

in response to determining that the first condition is maintained for the first reference time or longer, determining a second condition maintained for a second reference time or longer, the second condition being defined such that an angle of the average values falls within reference ranges; and in response to determining that the second condition is maintained for the second reference time or longer, determining the failure of at least one of the phase current sensors.

12. The method of claim 11, wherein the motor is a 3-phase motor, and wherein the phase current sensors comprise first to third phase current sensors for respectively detecting A-phase current, B-phase current and C-phase current supplied to the 3-phase motor.

13. The method of claim 12, wherein the reference ranges are respectively set for the A-phase current, B-phase current and C-phase current.

14. The method of claim 13, wherein one of the reference ranges for the A-phase current is 0.2 to 0.7 rad/s.

15. The method of claim 13, wherein one of the reference ranges for the B-phase current is 2.5 to 2.8 rad/s.

16. The method of claim 13, wherein one of the reference ranges for the C-phase current is −1.7 to −1.1 rad/s.

17. The method of claim 13, further comprising:

determining that one of the A-phase current, the B-phase current and the C-phase current is less than the magnitude of the average values; and determining the failure of at least one of the phase current sensors based on determining that one phase current is less than the magnitude of the average values.

* * * * *